US006651199B1

(12) United States Patent
Shokouhi

(10) Patent No.: US 6,651,199 B1
(45) Date of Patent: Nov. 18, 2003

(54) IN-SYSTEM PROGRAMMABLE FLASH MEMORY DEVICE WITH TRIGGER CIRCUIT FOR GENERATING LIMITED DURATION PROGRAM INSTRUCTION

(75) Inventor: Farshid Shokouhi, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 559 days.

(21) Appl. No.: 09/603,464

(22) Filed: Jun. 22, 2000

(51) Int. Cl.[7] ............................................. G01R 31/28
(52) U.S. Cl. .................... 714/727; 714/731; 365/185.33
(58) Field of Search ................................. 714/727, 724, 714/731; 365/185.33, 193; 716/17; 713/400, 502, 401, 600, 601; 711/3

(56) References Cited

U.S. PATENT DOCUMENTS

| | | | | |
|---|---|---|---|---|
| 4,165,540 A | * | 8/1979 | Vinot .......................... 365/190 |
| 4,435,761 A | * | 3/1984 | Kimoto ....................... 713/601 |
| 4,916,670 A | * | 4/1990 | Suzuki et al. ................ 365/233 |
| 5,325,368 A | * | 6/1994 | James et al. ................. 714/727 |
| 5,434,804 A | * | 7/1995 | Bock et al. ................... 702/117 |
| 5,436,865 A | * | 7/1995 | Kitazawa ..................... 365/194 |
| 5,452,253 A | * | 9/1995 | Choi ........................... 365/201 |
| 5,680,594 A | * | 10/1997 | Charneski et al. .......... 713/501 |
| 5,717,702 A | * | 2/1998 | Stokes et al. ................ 714/730 |
| 5,734,868 A | * | 3/1998 | Curd et al. ...................... 716/5 |
| 5,793,776 A | * | 8/1998 | Qureshi et al. ............. 714/724 |
| 5,841,867 A | * | 11/1998 | Jacobson et al. ........... 713/187 |
| 5,859,995 A | * | 1/1999 | Hewitt ........................ 713/400 |
| 5,889,701 A | * | 3/1999 | Kang et al. .............. 365/185.18 |
| 5,900,753 A | * | 5/1999 | Cote et al. ................... 327/145 |
| 5,901,108 A | * | 5/1999 | Roohparvar ................ 365/233 |
| 5,940,599 A | * | 8/1999 | Urano et al. ................ 710/100 |
| 5,944,837 A | * | 8/1999 | Talreja et al. ............... 713/600 |
| 5,946,267 A | * | 8/1999 | Pathak et al. ................ 365/233 |
| 5,954,832 A | * | 9/1999 | LeBlanc ....................... 714/724 |
| 5,968,180 A | * | 10/1999 | Baco ........................... 713/400 |
| 6,023,778 A | * | 2/2000 | Li ................................ 714/726 |
| 6,102,963 A | * | 8/2000 | Agrawal ........................ 716/17 |
| 6,161,199 A | * | 12/2000 | Szeto et al. .................... 714/30 |
| 6,243,842 B1 | * | 6/2001 | Slezak et al. ................ 714/724 |
| 6,286,119 B1 | * | 9/2001 | Wu et al. ..................... 714/726 |
| 6,327,684 B1 | * | 12/2001 | Nadeau-Dostie et al. ... 714/731 |
| 6,442,722 B1 | * | 8/2002 | Nadeau-Dostie et al. ... 714/731 |
| 6,539,510 B1 | * | 3/2003 | St. Pierre et al. ........... 714/727 |

OTHER PUBLICATIONS

'IEEE Std 1149.1 (JTAG) Testability Primer', Texas Instruments, 1997.*
Bhavar, "Synchronizing the IEEE 1149.1 Test Access Port for Chip–level Testability", IEEE Design & Test of Computers, IEEE, 2000.*
Bhavsar, "A method for synchronizing IEEE 1149.1 test access port for chip level testability acess", VLSI Design Proceeds, 1998.*

* cited by examiner

Primary Examiner—Albert Decady
Assistant Examiner—William Moore
(74) Attorney, Agent, or Firm—Patrick T. Bever; Lois D. Cartier; Edel M. Young

(57) ABSTRACT

A trigger circuit for an In-System Programmable (ISP) memory device that operates with a JTAG interface. The trigger circuit receives instruction signals from the JTAG control circuitry, and limits the duration of these instruction signals to avoid erroneously repeating ISP programming operations. The trigger circuit includes a first logic circuit, a delay circuit, and a second logic circuit. The first logic circuit generates a logic high output when both the JTAG RUN-TEST and a program instruction signal are simultaneously asserted, and causes the second logic circuit to toggle the limited duration instruction signal into a logic high state. The delay circuit also detects the simultaneous assertion of the JTAG RUN-TEST and a program instruction signal, and generates a cancellation signal after a predetermined number of clock cycles. The cancellation signal causes the second logic circuit to toggle the limited duration instruction signal into a logic low state.

20 Claims, 7 Drawing Sheets

IN-SYSTEM PROGRAMMABLE FLASH MEMORY DEVICE WITH TRIGGER CIRCUIT FOR GENERATING LIMITED DURATION PROGRAM INSTRUCTION

FIELD OF INVENTION

The present invention relates to In-System Programmable (ISP) Flash memory devices. In particular, it relates to ISP Flash memory devices that incorporate JTAG test circuitry.

BACKGROUND OF THE INVENTION

In-System Programmable (ISP) Flash memory devices are programmable logic devices (PLDs) that make use of electrically erasable and programmable Flash memory cells and are capable of being programmed or re-programmed while mounted on a system board. ISP refers to the entire process of programming a device in-system, and, therefore, encompasses the actions of erasing and verifying the design in the device in addition to the specific action of memory cell programming. ISP allows for speedier product development and facilitates the process of improving a PLD in a system.

Some ISP Flash devices contain a so-called JTAG interface through which a user can program the device. This interface is a standard specified in "IEEE Standard Test Access Port and Boundary-Scan Architecture", IEEE Std 1149.1-1990 (includes IEEE Std 1149.1a-1993), published by the Institute of Electrical and Electronics Engineers, Inc. on Oct. 21, 1993. The JTAG standard creates a means of verifying the integrity of traces between components on an assembled printed circuit board by providing a standard architecture and a set of mandatory public instructions that all vendors claiming conformance to IEEE standard 1149.1 must support.

When programming Flash memory using a JTAG interface, a JTAG instruction register circuit (i.e., an instruction register and instruction decoder) shifts instruction data and an internal statemachine (TAP controller) is required to control the programming states and time. Generally, JTAG-based operating systems issue a general program instruction (INSTN), which then initiates a JTAG RUN-TEST signal. When both INSTN and RUN-TEST signals are asserted, the TAP controller begins a program state (or similarly the erase, blank check or program verify states), and programming of the ISP Flash device is ultimately initiated. When programming is finished, the TAP controller goes into a discharge state where the logic high voltage signals INSTN and RUN-TEST are discharged, followed by returning to an idle state. Typically, the programming state lasts approximately 5 msec, and the discharge state lasts approximately 18 $\mu$ sec.

A problem is associated with JTAG-based operating systems, however. Shifting program instruction data with the JTAG instruction register circuit and changing the state of the TAP controller requires several clock cycles for completion. Accordingly, a particular set of instruction signals (e.g., RUN-TEST and INSTN) may be maintained for a longer period of time than is necessary to perform a desired operation. As a result, the programming operation for a row of memory cells may be completed, and the TAP controller may return to an idle state before the RUN-TEST and INSTN signal are changed. When this occurs, conditions hold for a second programming operation for the already-programmed row of memory cells, which can produce undesirable programming states in the Flash memory cells.

It is therefore desirable to have a circuit that changes the JTAG instruction signals into limited duration instructions signals that toggle high long enough to initiate the program, erase, blank check or program verify functions and then toggle low to prevent repeating the operation before the JTAG RUN-TEST and INSTN signals can be changed.

SUMMARY OF THE INVENTION

The present invention provides an ISP Flash memory device that addresses the problem discussed above.

In accordance with the present invention, an ISP Flash memory device includes a trigger circuit for generating instruction signals that control the operating state of a control state machine so that it transmits appropriate control signals to a memory circuit during the various operations performed by the ISP Flash memory device. The trigger circuit prevents a second programming operation once the row of memory cells has already been programmed by changing the instruction signal received from a JTAG instruction decoder into a limited duration instruction signal that toggles high only long enough to effect the desired state change in the control state machine.

The trigger circuit includes a first AND gate, a delay circuit, an inverter and a second AND gate. The first AND gate has input terminals connected to receive a RUN-TEST signal from a JTAG TAP controller and an instruction signal. It generates a logic high output signal when both the RUN-TEST and instruction signals are asserted. The delay circuit also has an input terminal connected to receive the RUN-TEST signal. It generates a logic high output a predetermined number of clock cycles after the RUN-TEST signal is asserted. The inverter is connected to the output terminal of the delay circuit. Finally, the second AND gate has a first input terminal connected to an output terminal of the first AND gate, a second input terminal connected to an output terminal of the inverter, and an output terminal for transmitting a pulse instruction signal to a control state machine. The control state machine includes a logic AND gate that generates a high control signal when both the pulse instruction signal received from the trigger circuit and the RUNT-TEST signal received from the JTAG TAP controller are asserted.

BRIEF DESCRIPTION OF THE DRAWINGS

The advantages, features and design of the invention will become apparent from the following detailed description of the invention and the accompanying drawings in which like reference numerals refer to like elements and in which.

DETAILED DESCRIPTION OF THE INVENTION

In accordance with the present invention, a novel In-System Programmable (ISP) Flash memory device is provided that employs the JTAG interface and prevents undesired reprogramming of the same memory row. In the following description, numerous specific details are set forth to provide a more thorough description of the present invention. It will be apparent, however, to one skilled in the art, that the present invention may be practiced without these specific details. In other instances, well known features have not been described in detail so as not to obscure the present invention.

Figure 1:
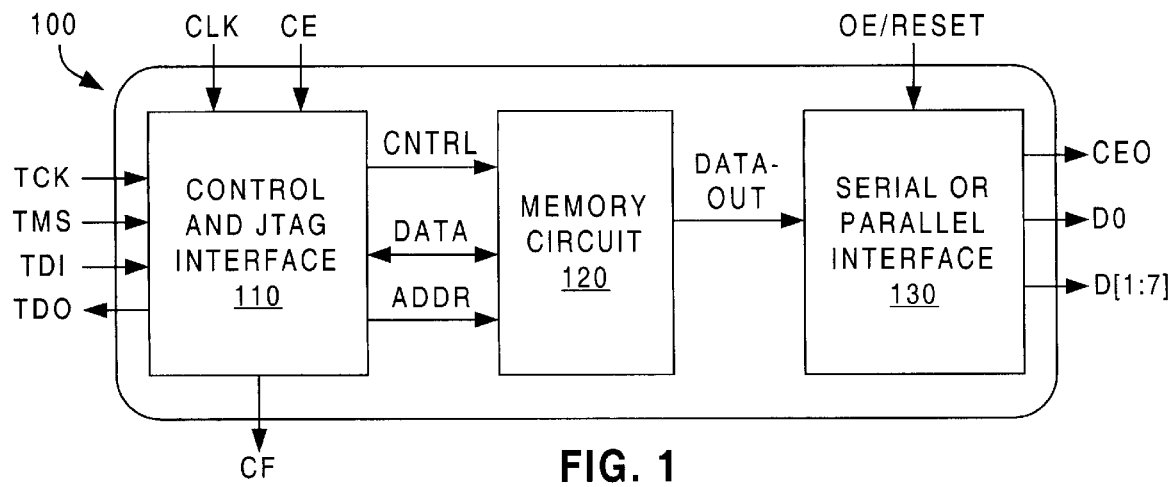
FIG. 1 is a block diagram of an In-System Programmable (ISP) Flash device incorporating the present invention.

FIG. 1 is a block diagram showing an In-System Programmable (ISP) Flash device 100 that incorporates the present invention. ISP Flash memory device 100 is consistent with memory devices of the XC18V00 family of In-System Programmable Configuration PROMs that are produced by Xilinx, Inc., of San Jose, Calif. A primary function of the XC18V00 family is to store configuration data for SRAM-based Programmable Logic Devices (PLDs) that are also produced by Xilinx, Inc.

Referring to FIG. 1, ISP Flash device 100 generally includes a control/JTAG interface circuit 110, a memory circuit 120, and a serial/parallel interface 130. ISP Flash device 100 receives in-system programming instructions and data using conventional JTAG signals. JTAG interface circuit 110 also receives an external clock signal CLK and daisy chain control signals CE and CF. JTAG interface circuit 110 generates control signals (CONTROL) and memory address (ADDR) signals that are transmitted to memory circuit 120 during program, read, and other operations to control the storage of data (DATA) therein. During PLD configuration (read) operations, data is read from memory circuit 120 and transmitted through serial/parallel interface circuit 130 (along with other control signals) to one or more target PLDs.

Figure 2:
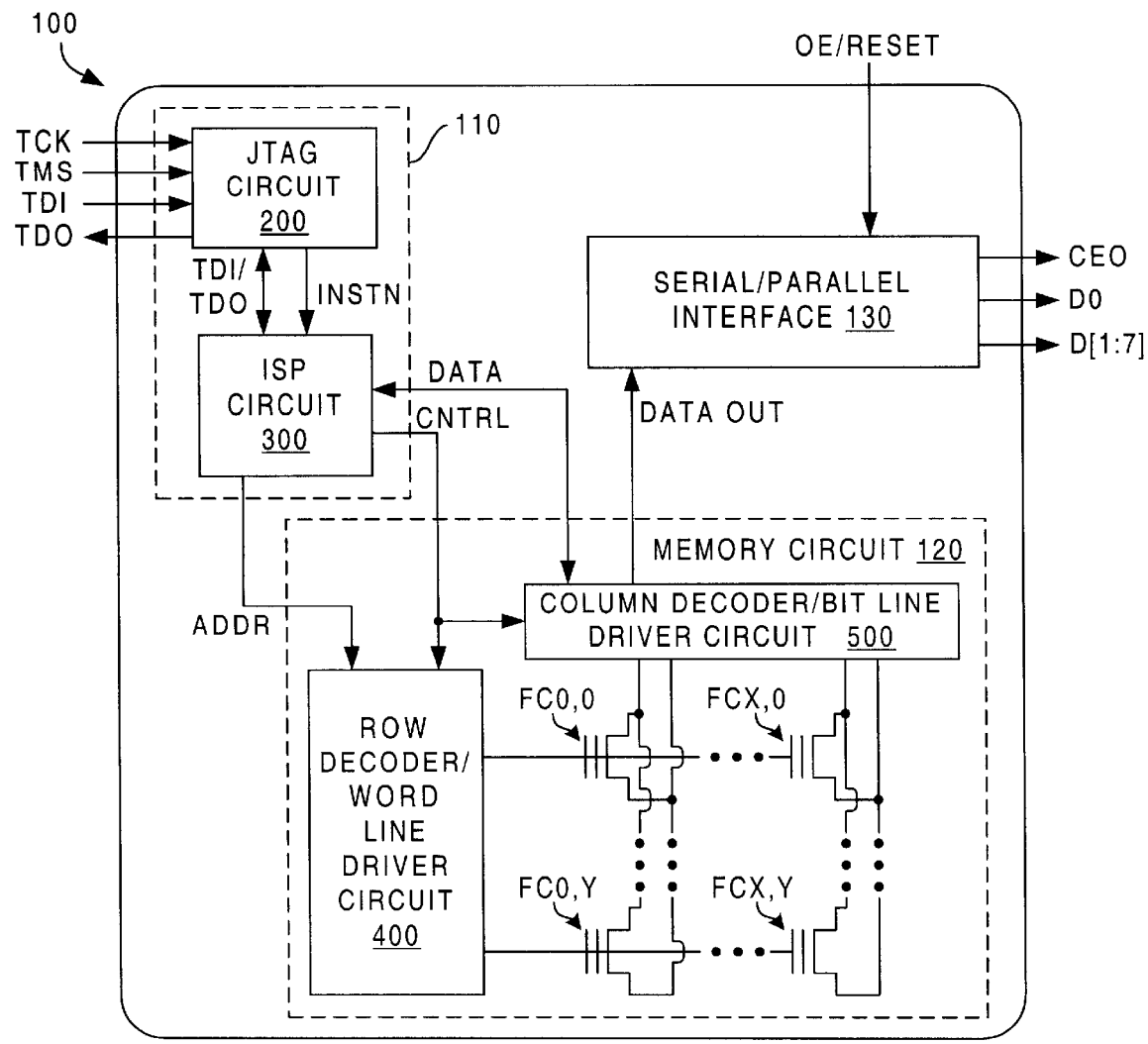
FIG. 2 is an expanded block diagram of the ISP Flash device shown in FIG. 1.

FIG. 2 is an expanded block diagram showing ISP Flash device 100 in additional detail. In particular, control and JTAG interface circuit 110 is separated into two components: a "standard" JTAG circuit 200 (discussed below with reference to FIGS. 3(A) and 3(B)), and an In-System Programming (ISP) circuit 300 that incorporates the present invention. In addition, memory circuit 120 is separated into a word line control circuit 400, a bit line control circuit 500, and an array 125 of flash memory cells FC0,0 through FCX,Y. As discussed in detail below, ISP circuit 300 operates in response to various instruction (INSTN) signals provided by JTAG circuit 200 to generate address (ADDR) and control (CNTRL) signals that are transmitted to word line control circuit 400 and bit line control circuit 500 of memory circuit 120.

Figure 3A:
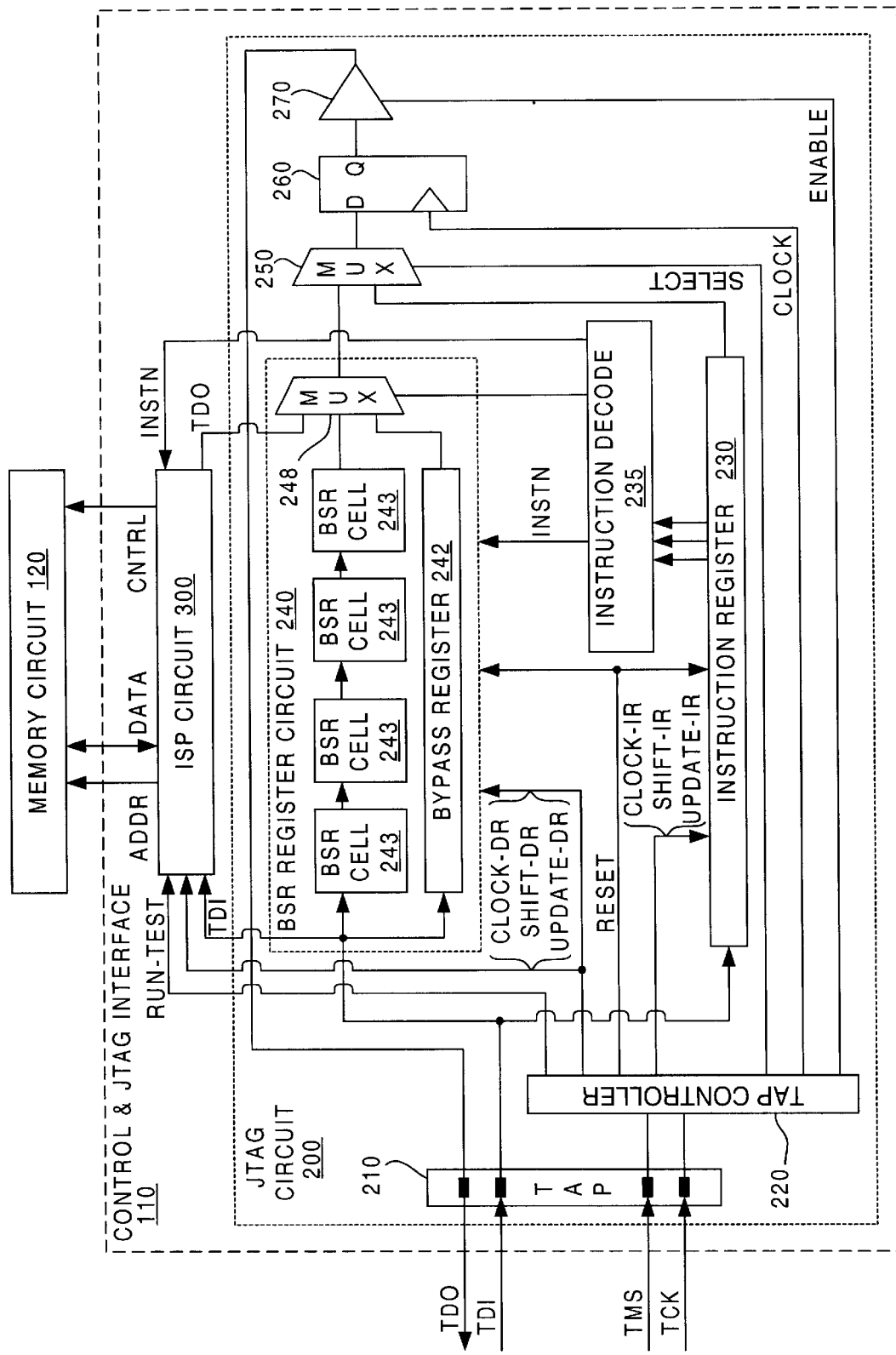
FIG. 3(A) is a detailed block diagram depicting an example of hardware elements associated with JTAG circuitry according to IEEE Standard 1149.1.

FIG. 3(A) is a detailed block diagram showing an example of the basic hardware elements associated with JTAG circuit 200 according to IEEE Standard 1149.1. The basic hardware elements include a test access port (TAP) 210, a TAP controller 220, an instruction register (IR) 230, an instruction decoder 235, a test data (BSR) register circuit 240, an output multiplexer (MUX) 250, an output flip-flop 260, and a tri-state buffer 270. As indicated at the upper portion of FIG. 3, ISP circuit 300 forms a special register that is essentially connected in parallel with other registers of BSR register circuit 240.

The various components of JTAG circuit 200 operate according to well-known JTAG protocols. TAP 210 provides access to the test support functions built into an IEEE Standard 1149.1 compliant PLD. TAP 210 includes three input connections for receiving the test clock input (TCK) signal, the test mode select (TMS) signal, and the test data input (TDI) signal. The TMS signal is used to control the state of TAP controller 220, as discussed below. The TDI signal is used for serial transmission of data or instruction bits, depending upon the state of TAP controller 220. In addition to the above-mentioned input connections, TAP 210 includes an output connection through which the TDO signals are transmitted. Depending upon the state of TAP controller 220, the TDO signal is used to serially shift either instruction register or data register contents out of JTAG circuit 200.

Figure 3B:
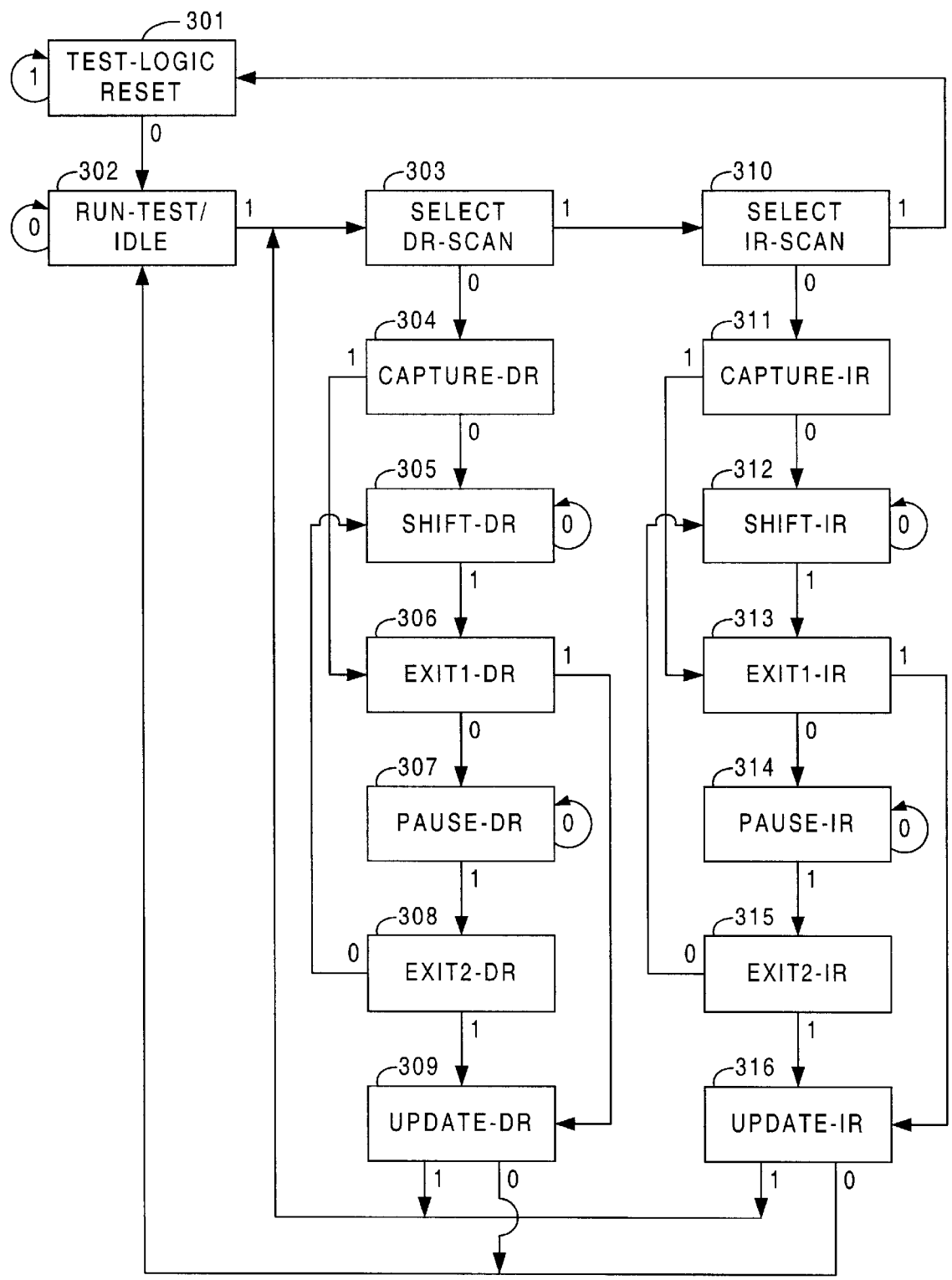
FIG. 3(B) is a state diagram explaining the operation of a TAP controller.

FIG. 3(B) is a state diagram for explaining the operation of TAP controller 220 (shown in FIG. 3(A)). The basic function of TAP controller 220 is to generate clock and control signals required for the correct sequence of operations of instruction register 230, BSR register circuit 240, output MUX 250, output flip-flop 260 and tri-state buffer 270. Specifically, TAP controller 220 controls signals that facilitate loading of instructions into instruction register 230, shifting TDI data into and TDO data out of the data registers in test data register circuit 240, and performing test actions such as capture, shift and update test data. These signals are provided in accordance with the state of TAP controller 220. All state transitions (indicated as arrows in FIG. 3(B)) within TAP controller 220 occur in accordance with the serially received TMS values (shown next to each arrow). TAP controller 220 is initialized to a Test-Logic Reset state 301. From Test-Logic Reset state 301, TAP controller 220 enters a Run-Test/Idle state 302 when TMS is held low (logic 0) for at least one TCK pulse. TAP controller 220 is placed in this state while, for example, program, erase, blank and verify operations are performed on the flash memory cells of memory circuit 120 (as discussed below), and remains in this state until TMS is held high. During test procedures, TAP controller 220 either enters a '-DR' branch of the state machine (i.e., states 303 through 309), or a '-IR' branch of the state machine (i.e., states 310 through 316). When TAP controller 220 enters the '-DR' branch of the state diagram, either a selected data register (or serially connected set of registers) of BSR register circuit 240 or a data shift register associated with ISP circuit 300 (discussed below) is connected between TDI and TDO (see FIG. 3(A)). Capture-DR state 304 is used to load data from, for example, an input pin of the PLD. Shift-DR state 305 is used to shift previously captured data toward the TDO connector such that the data is shifted by one serially connected register per TCK pulse. Exit1-DR state 306, Pause-DR state 307, and Exit2-DR state 308 are provided to switch between selected states and to temporarily halt a shifting process to allow, for example, synchronization between TCK and system clock signals, when needed. TAP controller 220 remains in Pause-DR state 307 until TMS is held high, at which time it enters Exit2-DR state 308. From Exit2-DR state 308, TAP controller 220 either returns to Shift-DR state 305, or enters Update-DR state 309. Once TAP controller 220 is in Update-DR state 309, data shifting to/between the selected register(s) is completed, and the data stored in the selected register(s) is passed, for example, to the output pins of JTAG circuit 200. From Update-DR state 309, TAP controller 220 either returns to Run-Test/Idle state 302 when TMS is held low, or to Select-DR state 303 when TMS is held high.

In contrast to the '-DR' branch, instruction register 230 is connected between TDI and TDO when TAP controller 220 enters the '-IR' branch (states 310 through 316) of the state diagram. The '-IR' branch is used to load instructions that are used, for example, to select a data register (or serially-connected set of registers) of BSR register circuit 240 for subsequent test data operations. As can be observed in FIG. 3(B), states 310 through 316 of the '-IR' branch are respectively similar to states 303 through 309 of the '-DR' branch, and provide similar functions with respect to instruction register 230. Therefore, these states will not be discussed in further detail.

Referring again to FIG. 3(A), instruction register 230 receives and stores test instructions transmitted to ISP Flash device 100. When TAP controller 220 is in Shift-IR state 312 (see FIG. 3), instruction register 230 (which in fact includes a series of individual registers) is connected between the TDI and TDO connectors. The test instruction data subsequently shifted into instruction register 230 is decoded by instruction decoder 235, which then generates one or more corresponding instruction signals (INSTN) that are transmitted to a corresponding test data register of BSR register circuit 240 and/or to ISP circuit 300.

Figure 4:
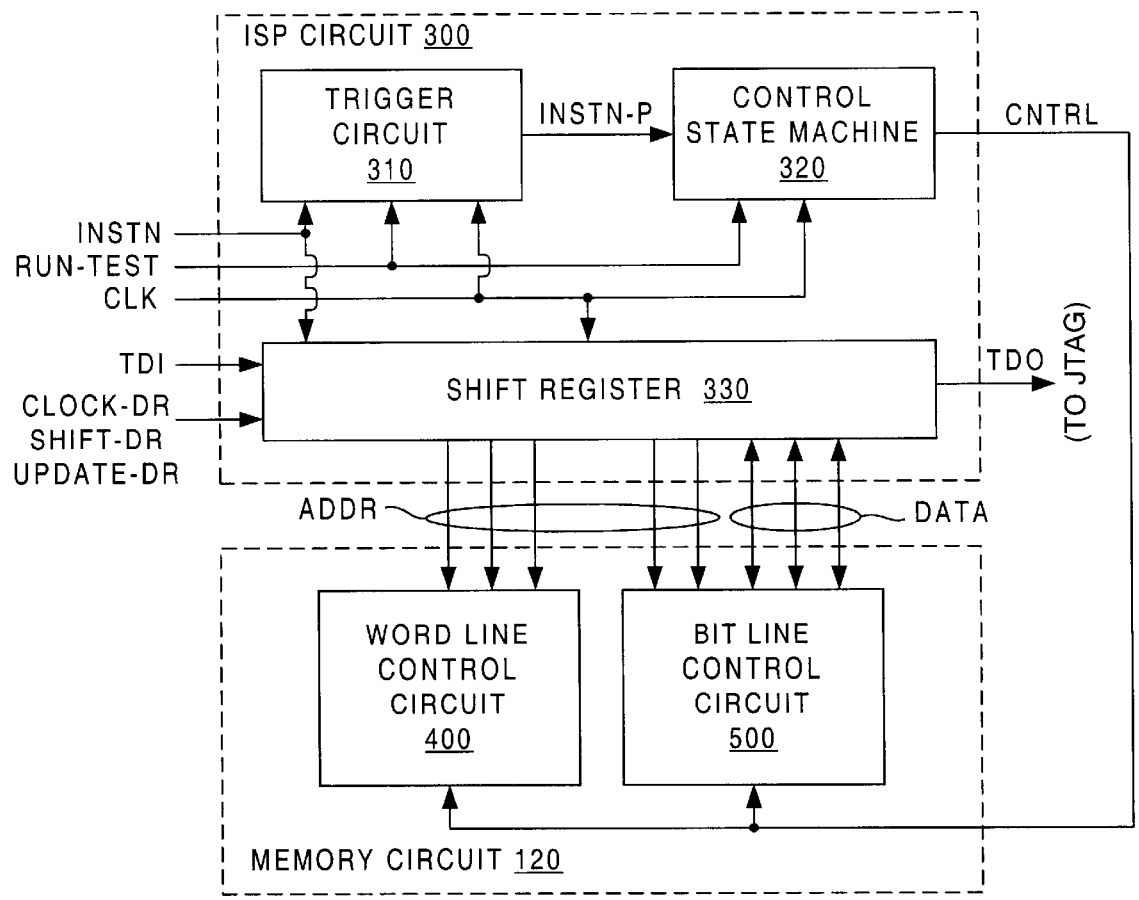
FIG. 4 is a block diagram showing the ISP circuit in additional detail.

FIG. 4 is a block diagram showing ISP circuit 300 in additional detail. ISP circuit 300 generally includes a trigger circuit 310, a control state machine 320, and a shift register 330. Trigger circuit 310 receives one or more instruction signals (INSTN) from instruction decoder 235 (see FIG. 3(A)), a RUN-TEST signal that is generated when TAP controller 210 is in RUN-TEST/IDLE state 302 (see FIG. 3(B)), and a clock signal CLK (which can be either the JTAG TCK signal or an internal clock signal). In accordance with the present invention, trigger circuit 310 generates a pulse instruction signal (INSTN-P) that is supplied to control state machine 320, which also receives the RUN-TEST signal and the CLK signal. Control state machine 320 generates one or more control signals (CNTRL) that are transmitted to word line control circuit 400 and bit line control circuit 500 of memory circuit 120. In addition, data bits are shifted into shift register 330 in accordance with the JTAG procedures described above, and are then provided as address (ADDR) signals and DATA signals to word line control circuit 400 and bit line control circuit 500. The operation of control circuit 400 and bit line control circuit 500 is described, for example, in co-owned and co-pending U.S. Pat. application Ser. No. 09/603,458, entitled "BIT-LINE LATCH SWITCHING CIRCUIT FOR FLOATING GATE MEMORY DEVICE REQUIRING ZERO VOLT PROGRAMMING VOLTAGE", which is incorporated herein in its entirety.

Although indicated as part of ISP circuit 300, shift register 330 may be incorporated into and/or shared with another circuit group of ISP flash device 100. For example, a portion of shift register 330 may be incorporated into bit line control circuit 500.

According to the present invention, trigger circuit 310 generates limited duration (pulse) instruction signals that control the operating state of control state machine 320 such that it transmits appropriate control signals (CNTRL) to memory circuit 120 during the various operations performed by ISP Flash memory device 100 (e.g., program, erase, and read). As indicated above, a problem associated with JTAG-based operating systems is that the generation of, for example, program instructions by the instruction register circuit (i.e., instruction register 230 and instruction decoder 235; see FIG. 3(A)) requires several clock cycles to shift in the instruction data. Similarly, several clock cycles are typically required to change the state of TAP controller 220. Accordingly, a particular set of instruction signals (e.g., RUN-TEST and INSTN) may be maintained for a longer period of time than is necessary to perform a desired operation. Accordingly, control state machine may perform, for example, a programming operation for a row of memory cells and return to an idle state before the RUN-TEST and INSTN signals are changed. When this occurs, control state machine 320 may perform a second programming operation for the already-programmed row of memory cells, which can produce undesirable programming states in the Flash memory cells. Trigger circuit 310 prevents this by changing the instruction signal received from instruction decoder 235 into a limited duration instruction signal INSTN-P that toggles high long enough to effect the desired state change in control state machine 320 (thereby initiating a desired operation), and then toggles low to prevent repeating the operation before the RUN-TEST and INSTN signals can be changed.

Figure 5:
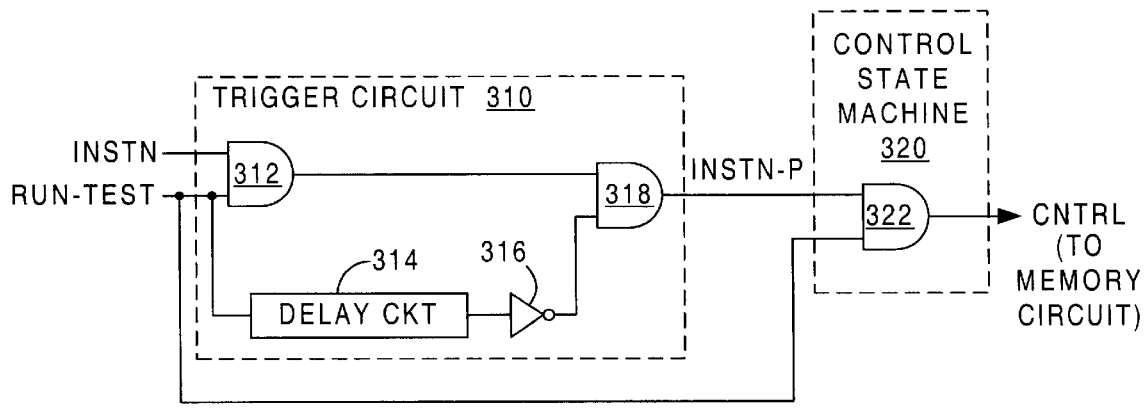
FIG. 5 is a simplified schematic diagram of the trigger circuit according to an embodiment of the present invention.

FIG. 5 is a simplified schematic diagram showing trigger circuit 310 according to an embodiment of the present invention. Trigger circuit 310 includes a first AND gate 312, a delay circuit 314, an inverter 316, and a second AND gate 318. First AND gate (logic circuit) 312 has input terminals connected to receive the RUN-TEST signal and the instruction signal INSTN, and generates a logic high output signal when both the RUN-TEST signal and the instruction signal INSTN are asserted. Delay circuit 314 has an input terminal connected to receive the RUN-TEST signal, and generates a logic high output a predetermined number (e.g., one, two or more) of clock cycles after the RUN-TEST signal is asserted. Inverter 316 is connected to an output terminal of delay circuit 314. Finally, second AND gate (logic circuit) 318 has a first input terminal connected to an output terminal of first AND gate 312, a second input terminal connected to an output terminal of inverter 316, and an output terminal for transmitting a pulse instruction signal INSTN-P to control state machine 320.

FIG. 5 also shows a simplified representation of control state machine 320. In particular, control state machine 320 includes a logic AND gate 322 that generates a high control signal CNTRL when both the pulse instruction signal INSTN-P received from trigger circuit 310 and the RUN-TEST signal received from the TAP controller are asserted. Note that circuitry associated with specific control functions performed by control state machine 320 is omitted to clarify the present invention. Some of the additional functions performed by control state machine 320 are discussed below with reference to FIG. 6.

In operation, during idle periods both instruction signal INSTN and the RUN-TEST signal remain low. The low RUN-TEST signal is inverted by inverter 316 and applied as a logic high signal to the lower input terminal of first AND gate 318. Subsequently, when an associated instruction is shifted into instruction register 230 and decoded by instruction decoder 235 (see FIG. 3(A)), instruction signal INSTN is asserted high, thereby causing second AND gate 318 to generate a high output signal. Note that this high instruction signal INSTN is ignored by control state machine 320 while the RUN-TEST signal remains low. Subsequently, when the RUN-TEST signal shifts high to initiate the operation, control state machine 320 asserts control signal CNTRL, thereby initiating a desired operation in memory circuit 120. A predetermined delay period after the TAP controller enters the RUN-TEST/IDLE state, the RUN-TEST signal propagates through delay circuit 314 and is inverted by inverter 316, thereby causing AND gate 318 to generate a logic low output signal. This logic low output signal is then applied to control state machine 320, thereby preventing undesirable redundant operations from being performed.

Figure 6:
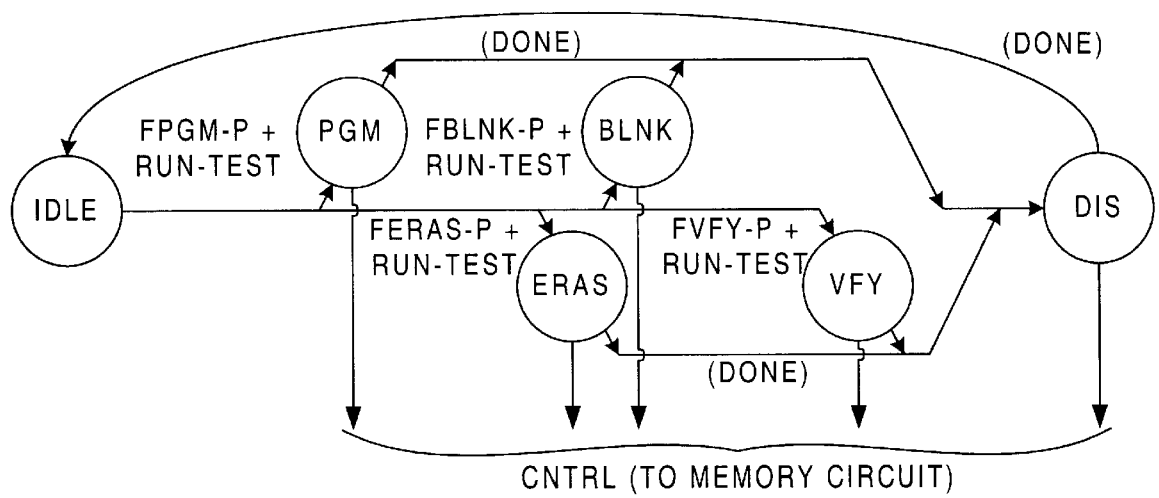
FIG. 6 is a state diagram showing various function performed by the control state machine in accordance with the present invention.

FIG. 6 is a state diagram showing various functions performed by control state machine 320 in accordance with the present invention. Control state machine 320 remains in an IDLE state until receiving an asserted pulse instruction signal in combination with the asserted RUN-TEST signal. In particular, control state machine 320 enters a program (PGM) state when a program pulse instruction signal (FPGM-P) signal and the RUN-TEST signal are asserted simultaneously. In the program state, a program control signal is asserted to memory circuit 120, which applies predefined programming voltages onto selected word and bit lines to program selected flash memory cells. These applied voltages are described, for example, in co-pending U.S. patent application Ser. No. 09/603,458, which is cited above. At the conclusion of the programming operation (DONE), control state machine shifts to a discharge (DIS) state in which programming voltages are discharged from the selected word and bit lines. Upon completion of the discharge operation (DONE), control shifts back to the idle state. Note that the present invention prevents repeating the programming operation for a particular row of flash memory cells by limiting the duration of the instruction signal FPGM-P. Other operations are similarly performed. For example, control state machine 320 performs an erase (ERAS) operation when an erase pulse instruction signal (FERAS-P) signal and the RUN-TEST signal are asserted simultaneously. In addition, control state machine 320 performs a blank check (BLNK) operation when a blank check pulse instruction signal (FBLNK-P) signal and the RUN-TEST signal are asserted simultaneously. Finally, control state machine 320 performs a program verify (VFY) operation when a verify pulse instruction signal (FVFY-P) signal and the RUN-TEST signal are asserted simultaneously.

Figure 7:
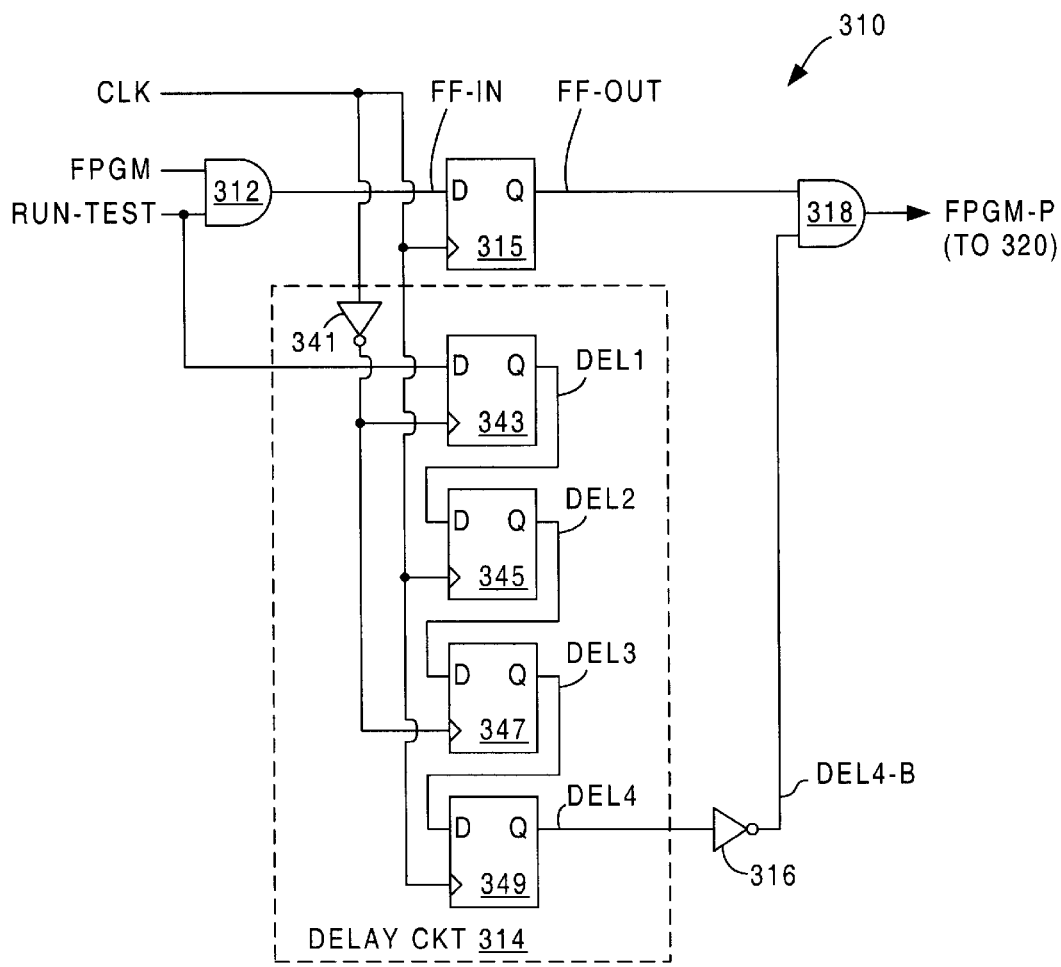
FIG. 7 is a simplified schematic diagram showing a portion of the trigger circuit in additional detail.

FIG. 7 is a simplified schematic diagram showing a portion of trigger circuit 310 in additional detail. In particular, FIG. 7 shows the portion of trigger circuit 310 that is associated with the generation of pulse program instruction signal FPGM-P, which is used to initiate a programming operation in memory circuit 120. In addition to the elements described with respect to FIG. 5, Circuit 310 also includes a first D flip-flop 315. D flip-flop 315 is positioned between the output of AND gate 312 (FF-IN) and one of the terminal inputs to AND gate 318. AND gate 312 generates the output signal FF-IN, which is then input into the date terminal of flip-flop 315. At the next rising edge of the clock signal CLK, flip-flop 315 changes its output signal FF-OUT to be equal to that of FF-IN. By including flip-flop 315, one delays when the pulse program instruction is initially asserted. Rather than starting shortly after the instruction and RUN-TEST signals are asserted high, FPGM-P toggles high at the next rising edge of the clock signal CLK, thereby slightly delaying when the control state circuit 320 initiates the appropriate program function.

Delay circuit 314 includes an inverter 341 and a series of D flip-flops 343, 345, 357 and 349. Flip-flop 343 has a data input terminal connected to receive the JTAG signal RUN-TEST and an input terminal connected to receive the clock signal CLK inverted. Flip-flop 343 switches its output signal DEL1 to be equal to input signal RUN-TEST at the next rising edge of the inverted CLK signal (which occurs simultaneously with the next falling edge of the original CLK signal). Flip-flop 345 has a data input terminal connected to receive the DEL1 signal and an input terminal connected to receive the original CLK signal. Flip-flop 345 switches its output signal DEL2 to be equal to input signal DEL1 at the next rising edge of the CLK signal. Flip-flop 347 has a data input terminal connected to receive the DEL2 signal and an input terminal connected to receive the CLK signal inverted. Flip-flop 347 switches its output signal DEL3 to be equal to input signal DEL2 at the next rising edge of the inverted CLK signal (which occurs simultaneously with the next falling edge of the original CLK signal). Finally, flip-flop 349 has a data input terminal connected to receive the DEL3 signal and an input terminal connected to receive the original CLK signal. Flip-flop 349 similarly switches its output signal DEL4 to be equal to input signal DEL3 at the next rising edge of the CLK signal. The output of delay circuit 314 is the DEL4 signal. In operation, during idle periods, DEL4 is low logic because the RUN-TEST signal is low logic. Once the RUN-TEST signal is asserted high, delay circuit 314 processes it over two clock cycles due to the series of flip-flops. Once DEL4 toggles high, pulse program instruction FPGM-P is terminated. Consequently, when used in conjunction with flip-flop 315, control state machine 320 receives the pulse program instruction FPGM-P for one full clock cycle before it is terminated regardless of whether the original JTAG RUN-TEST signal and program instruction signal FPGM still remain high. This ensures that a second programming of the same memory row is avoided.

Figure 8:
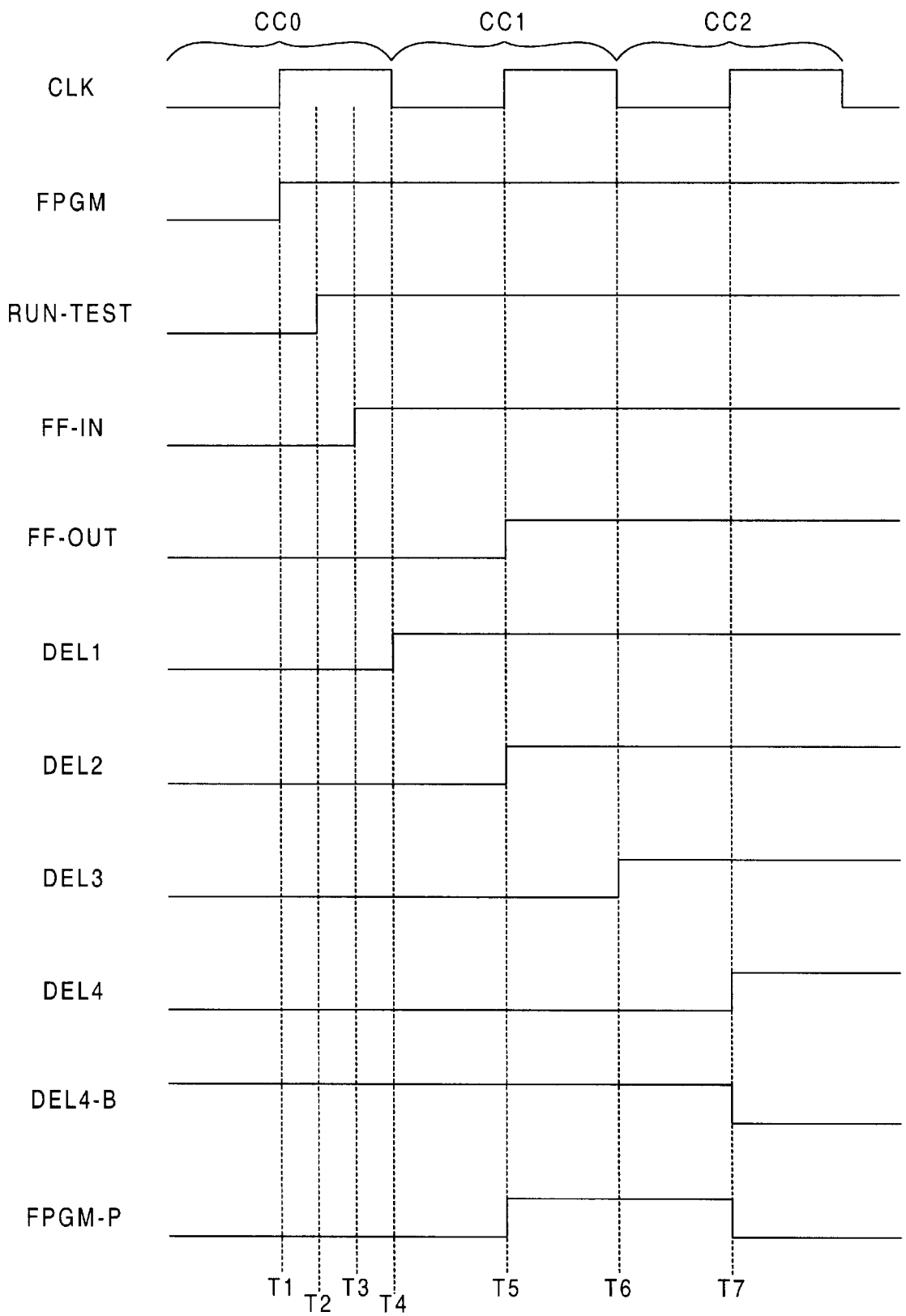
FIG. 8 is a timing diagram showing the operation of the portion of the trigger circuit that is shown in FIG. 7.

FIG. 8 is a timing diagram showing the operation of the portion of trigger circuit 310 that is shown in FIG. 7. A logic high programming signal FPGM coincides with a first rising edge of the clock CLK. The signal RUN-TEST becomes logic high shortly after FPGM becomes logic high. When both of these signals are logic high, then the signal FF-IN also switches to logic high. The FF-IN signal is fed into positive-edge D flip-flop 315, and, accordingly, at the next rising edge of CLK, the output of the D flip-flop, FF-OUT, also switches to logic high.

After the RUN-TEST signal is asserted high, the signal DEL1 becomes logic high at the first falling edge of CLK due to flip-flop 343. DEL2 becomes logic high at the next rising edge of CLK due to flip-flop 345. Then, as a result of flip-flop 347, DEL3 becomes logic high at the next falling edge of CLK. Finally, DEL4 switches to logic high at the following rising edge of CLK due to flip-flop 349. The signal DEL4-B is an immediate inverted signal of DEL4.

The signal FPGM-P becomes logic high when FF-OUT is logic high because both terminal inputs to AND gate 318 are logic high. FPGM-P returns to a logic low signal when DEL4-B, one of the input signals to AND gate 318, becomes logic low. Consequently, FPGM-P switches to a logic high signal one full clock period after FPGM does, and FPGM-P only remains logic high for one full clock period. Accordingly, trigger circuit 310 generates a limited duration (pulse) instruction signal for controlling the operating state of control state machine 320. Consequently, control state machine 320 transmits appropriate control signals (CNTRL) to memory circuit 120 during the various operations performed by ISP Flash memory device 100.

Figure 9:
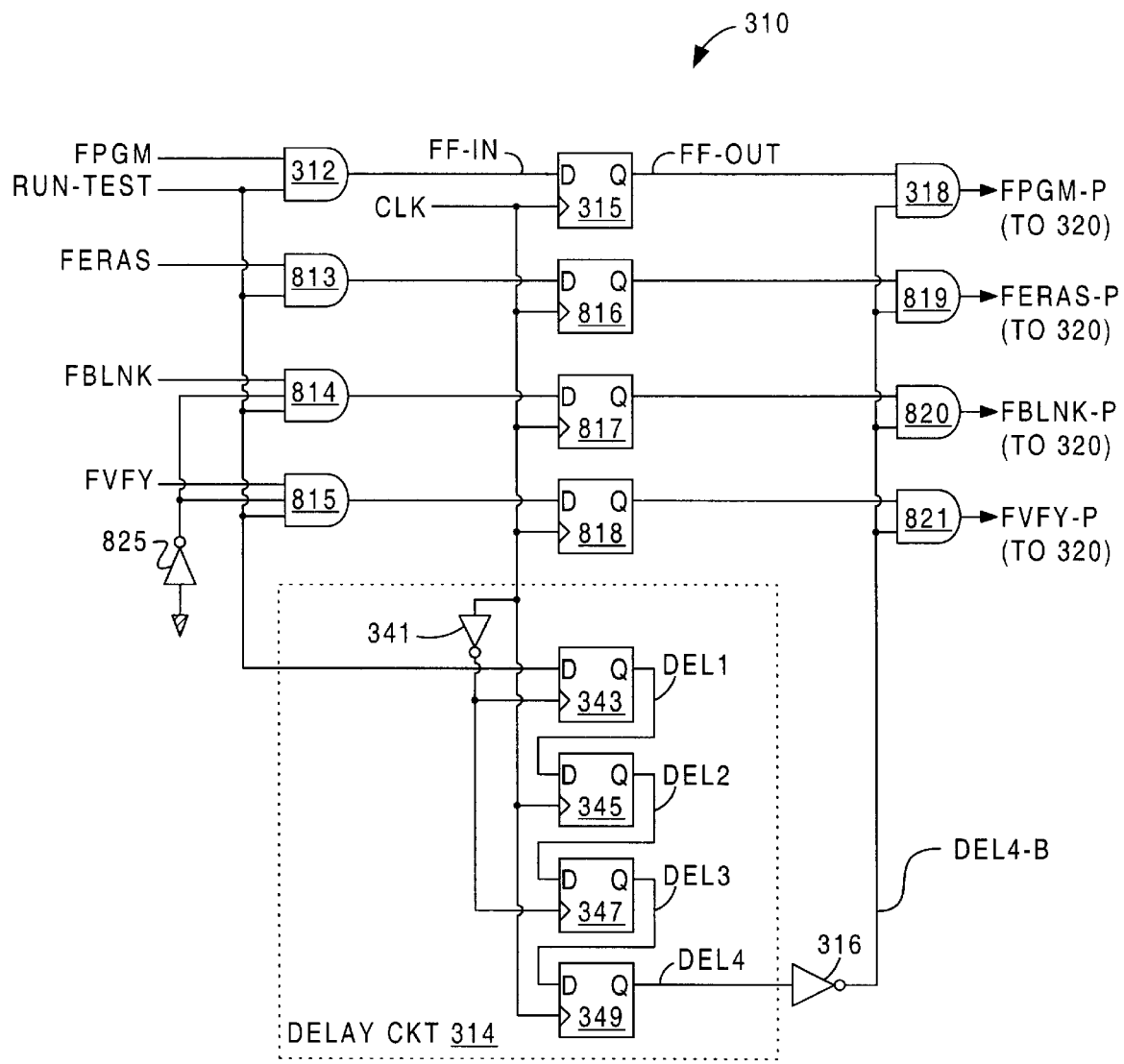
FIG. 9 is a schematic diagram showing the trigger circuit in additional detail.

FIG. 9 is a schematic diagram showing trigger circuit 310 in additional detail. Trigger circuit 310 also includes AND gates 813–815 and 819–821, inverter 825, and D flip-flops 816–818 for generating pulse instructions related to the JTAG erase, program verify and blank check functions. As with AND gate 312, each of AND gates 813–815 have an input terminal for receiving the JTAG RUN-TEST signal. AND gate 813 has another input terminal for receiving the JTAG erase instruction FERAS. AND gate 814 has a second input terminal for receiving JTAG blank check instruction FBLNK and a third input terminal that is connected to the output of inverter 825, the input of which is connected to ground. Similarly, AND gate 815 has a second input terminal for receiving the JTAG program verify instruction FVFY and a third input terminal that is also connected to the output of inverter 825.

Each of D flip-flops 816–818 has a data input terminal and an input terminal that receives the clock signal CLK. The data input terminal of flip-flop 816 receives the output signal of AND gate 813, the data input terminal of flip-flop 817 receives the output signal of AND gate 814, and the data input terminal of flip-flop 818 receives the output signal of AND gate 815. As with flip-flop 315, each of flip-flops 816–818 also produce an output signal equal to its input signal at the next rising edge of the clock signal CLK.

Finally, as with AND gate 318, each of AND gates 819–821 has one input terminal that receives the inverted output signal DEL4-B from the delay circuit 314. Each of AND gates 819–821 also has an input terminal that receives the output signal from one of the flip-flops 816–818. AND gate 819 receives the output signal from flip-flop 816, AND gate 820 receives the output signal from flip-flop 817, and AND gate 821 receives the output signal from flip-flop 818. Again, similar to AND gate 318, each of AND gates 819–821 generate a pulse instruction signal. AND gate 819 generates the pulse erase instruction signal FERAS-P, AND gate 820 generates the pulse blank instruction signal FBLNK-P, and AND gate 821 generates the pulse verify instruction signal FVFY-P.

The pulse instructions signals for the erase, blank check and program verify functions are generated consistent with how the pulse program instruction FPGM-P is generated. Both the generation of the pulse program instruction FPGM-P and the operation of delay circuit 314 are described above with respect to FIGS. 5 and 7.

The erase pulse instruction FERAS-P is generated when the JTAG RUN-TEST signal and instruction signal FERAS are asserted high. FERAS is asserted and shortly thereafter the JTAG signal RUN-TEST is asserted. When both of these signals are logic high, the output of AND gate 813 switches to logic high as well. At the next rising edge of the clock signal CLK, the output of flip-flop 816 also switches high and the erase pulse instruction FERAS-P is communicated to control state machine 320, thereby initiating the erase function. Erase pulse instruction FERAS-P then remains logic high for a full clock cycle due to delay circuit 314, after which time the instruction is terminated, thereby preventing control state machine 320 from reinitiating an erase function for the same memory row.

The blank check pulse instruction FBLNK-P is generated when the JTAG RUN-TEST signal and instruction signal FBLNK are asserted high. FBLNK is asserted and shortly thereafter the JTAG signal RUN-TEST is asserted. When both of these signals are logic high along with the third logic high input that comes from inverter 825, the output of AND gate 814 switches to logic high as well. At the next rising edge of the clock signal CLK, the output of flip-flop 817 also switches high and the blank check pulse instruction FBLNKS-P is communicated to control state machine 320, thereby initiating the blank check function. Blank check pulse instruction FBLNK-P then remains logic high for a full clock cycle due to delay circuit 314, after which time the instruction is terminated, thereby preventing control state machine 320 from reinitiating a blank check function for the same memory row.

The program verify pulse instruction FVFY-P is generated when the JTAG RUN-TEST signal and instruction signal FVFY are asserted high. FVFY is asserted and shortly thereafter the JTAG signal RUN-TEST is asserted. When both of these signals are logic high along with the third logic high input that comes from inverter 825, the output of AND gate 815 switches to logic high as well. At the next rising edge of the clock signal CLK, the output of flip-flop 818 also switches high, and the program verify pulse instruction FVFY-P is communicated to control state machine 320, thereby initiating the program verify function. Program verify pulse instruction FVFY-P then remains logic high for a full clock cycle due to delay circuit 314, after which time the instruction is terminated, thereby preventing control state machine 320 from reinitiating a program verify function for the same memory row.

Although this invention has been described in connection with the present embodiments, it is understood that this invention is not limited to the embodiments disclosed, but is capable of various modifications that would be apparent to a person skilled in the art. Thus, the invention is limited only by the following claims.

What is claimed is:

1. A trigger circuit for generating an instruction signal utilized by a control state machine in an In-System Programmable (ISP) memory device, the ISP memory device including a JTAG circuit having a standard TAP controller for generating a RUN-TEST signal when the TAP controller is in a RUN-TEST/IDLE state, and an instruction register circuit for generating a first instruction signal, the trigger circuit comprising:

a first logic circuit for generating a logic high output signal when both the RUN-TEST signal and the first instruction signal are in a first logic state;

a delay circuit for receiving the RUN-TEST signal and for generating a logic high output signal a predetermined number of clock cycles after the RUN-TEST signal changes to the first logic state;

an inverter connected to an output terminal of the delay circuit; and a second logic circuit having a first input terminal connected to an output terminal of the first logic circuit, a second input terminal connected to an output terminal of the inverter, and an output terminal connected to an input terminal of the control state machine, wherein the trigger circuit transmits a second instruction signal to the control state machine in response to the RUN-TEST signal and the first instruction signal being in the first logic state, wherein the second instruction signal is maintained in the first logic state for the predetermined number of clock cycles, thereby avoiding erroneous operation of the control state machine caused when the RUN-TEST signal and the first instruction signal remain in the first logic state for an extended period.

2. The trigger circuit of claim 1 wherein said first logic circuit comprises at least one AND logic gate having an output terminal, a first input terminal for receiving the RUN-TEST signal and a second input terminal for receiving the first instruction signal.

3. The trigger circuit of claim 2 wherein said first logic circuit further comprises at least one D-type flip-flop device having a data input terminal connected to the output terminal of said AND gate, a clock input terminal for receiving a clock signal, and a data output terminal connected to the input terminal of said second logic circuit.

4. The trigger circuit of claim 1 wherein said delay circuit comprises at least one D-type flip-flop device having a data input terminal for receiving the RUN-TEST signal, a clock input terminal for receiving a clock signal, and an output terminal.

5. The trigger circuit of claim 1 wherein said delay circuit comprises:
   a first D-type flip-flop device having a data input terminal for receiving the RUN-TEST signal, a clock input terminal for receiving a clock signal, and a data output terminal;
   a second D-type flip-flop device having a data input terminal connected to the output terminal of said first D-type flip-flop device, a clock input terminal for receiving a clock signal, and a data output terminal;
   a third D-type flip-flop device having a data input terminal connected to the output terminal of said second D-type flip-flop device, a clock input terminal for receiving a clock signal, and a data output terminal; and
   a fourth D-type flip-flop device having a data input terminal connected to the output terminal of said third D-type flip-flop device, a clock input terminal for receiving a clock signal, and a data output terminal connected to the input terminal for said inverter.

6. The trigger circuit of claim 5 wherein the first and third D-type flip-flop devices receive a clock signal that is the inverse of the clock signal received by the second and fourth D-type flip-flop devices.

7. The trigger circuit of claim 1 wherein said second logic circuit comprises an AND logic gate having an output terminal for transmitting a second instruction signal to the control state machine, a first input terminal connected to the output terminal of the first logic circuit and a second input terminal connected to the output terminal of the inverter.

8. A trigger circuit for generating an instruction signal utilized by a control state machine in an In-System Programmable (ISP) memory device, the ISP memory device including a JTAG circuit having a standard TAP controller for generating a RUN-TEST signal when the TAP controller is in a RUN-TEST/IDLE state, and an instruction register circuit for generating a first instruction signal, the trigger circuit comprising:
   a first means for initiating a first logic state of a second instruction signal when both the RUN-TEST signal and the first instruction signal are switched to a first logic state;
   a second means for transmitting said second instruction signal to said control state machine; and
   a third means for maintaining said instruction signal in a first logic state for a predetermined number of clock cycles, wherein erroneous operation of the control state machine is thereby avoided when the RUN-TEST signal and the first instruction signal remain in the first logic state for an extended period.

9. The trigger circuit of claim 8 wherein said first means comprises a first logic circuit for generating a logic high output signal when both the RUN-TEST signal and the first instruction signal are in a first logic state.

10. The trigger circuit of claim 9 wherein said first logic circuit comprises:
   an AND logic gate having an output terminal, a first input terminal for receiving the RUN-TEST signal and a second input terminal for receiving the first instruction signal; and
   a D-type flip-flop device having a data input terminal connected to the output terminal of said AND gate, a clock input terminal for receiving a clock signal, and a data output terminal connected to said second means.

11. The trigger circuit of claim 8 wherein said second means comprises:
   a delay circuit for receiving the RUN-TEST signal and for generating a logic high output signal a predetermined number of clock cycles after the RUN-TEST signal changes to the first logic state; and
   an inverter connected to an output terminal of the delay circuit.

12. The trigger circuit of claim 11 wherein said delay circuit comprises:
   a first D-type flip-flop device having a data input terminal for receiving the RUN-TEST signal, a clock input terminal for receiving a clock signal, and a data output terminal;
   a second D-type flip-flop device having a data input terminal connected to the output-terminal of said first D-type flip-flop device, a clock input terminal for receiving a clock signal, and a data output terminal;
   a third D-type flip-flop device having a data input terminal connected to the output terminal of said second D-type flip-flop device, a clock input terminal for receiving a clock signal, and a data output terminal; and
   a fourth D-type flip-flop device having a data input terminal connected to the output terminal of said third D-type flip-flop device, a clock input terminal for receiving a clock signal, and a data output terminal connected to the input terminal for said inverter.

13. The trigger circuit of claim 8 wherein said third means comprises a second logic circuit having a first input terminal connected to an output terminal of the first means, and a second input terminal connected to an output terminal of said second means, and an output terminal connected to an input terminal of the control state machine.

14. A method for generating an instruction signal utilized by a control state machine in an In-System Programmable (ISP) memory device, the ISP memory device including JTAG circuit having a standard TAP controller for generating a RUN-TEST signal when the TAP controller is in a RUN-TEST/IDLE state, and an instruction register circuit for generating a first instruction signal, comprising the steps of:
   initiating a first logic state of a second instruction signal in response to both the RUN-TEST signal and the first instruction signal switching to a first logic state;
   transmitting the second instruction signal to the control state machine; and
   maintaining said second instruction signal in a first logic state for a predetermined number of clock cycles,
   wherein erroneous operation of the control state machine is thereby avoided when the RUN-TEST signal and the first instruction signal remain in the first logic state for an extended period.

15. The method of claim 14 wherein said step of initiating a first logic state of a second instruction signal comprises:
   first inputting the RUN-TEST and first instruction signals into a first logic circuit when they are in a first logic state; and
   second generating a logic high output from said first logic circuit.

16. The method of claim 15 wherein said first logic circuit comprises an AND gate with a first input terminal for receiving the RUN-TEST signal, a second input terminal for receiving the first instruction signal, and an output terminal for generating a logic high output signal when both the RUN-TEST and first instruction signals are in a first logic state.

17. The method of claim 16 wherein said first logic circuit further comprises a D-type flip-flop device having a data input terminal for receiving said logic high output signal of said AND gate, a clock signal input for receiving a clock signal, and a data output terminal for generating a logic high output signal at the first rising edge of the clock signal after the logic high output signal of said AND gate is received.

18. The method of claim 14 wherein said step of maintaining said second instruction signal in a first logic state for a predetermined number of clock cycles comprises:

inputting said RUN-TEST signal into a delay circuit;

generating a logic high output signal after a predetermined number of clock cycles have elapsed; and inverting said logic high output.

19. The method of claim 14 wherein said step of transmitting the second instruction signal to the control state machine is accomplished using a second logic circuit with an output terminal connected to the control state machine, wherein said second logic circuit first receives the logic high output generated from said first logic circuit and second receives the inverted logic high output from the delay circuit after a predetermined number of clock cycles have elapsed.

20. The method of claim 19 wherein said second logic circuit comprises an AND gate having a first input terminal for receiving the output of said first control circuit and a second input terminal for receiving the inverted output of said delay circuit.

* * * * *